United States Patent
Ellwein et al.

(10) Patent No.: US 10,459,033 B2
(45) Date of Patent: Oct. 29, 2019

(54) METHOD FOR PROTECTING A NONMOBILE WORK MACHINE DRIVEN BY AN ELECTRIC MOTOR, AND NONMOBILE WORK MACHINE DRIVEN BY AN ELECTRIC MOTOR

(71) Applicant: KRIWAN Industrie-Elektronik GmbH, Forchtenberg (DE)

(72) Inventors: Christian Ellwein, Schwäbisch Hall (DE); Xiaoming Peng, Öhringen (DE); Christian Grub, Weißbach (DE)

(73) Assignee: KRIWAN INDUSTRIE-ElEKTRONIK GMBH, Forchtenberg (DE)

( * ) Notice: Subject to any disclaimer, the term of this patent is extended or adjusted under 35 U.S.C. 154(b) by 296 days.

(21) Appl. No.: 15/590,223

(22) Filed: May 9, 2017

(65) Prior Publication Data

US 2017/0322260 A1    Nov. 9, 2017

(30) Foreign Application Priority Data

May 9, 2016   (DE) .................. 10 2016 108 506

(51) Int. Cl.
*H02P 21/26*    (2016.01)
*H02P 23/14*    (2006.01)
(Continued)

(52) U.S. Cl.
CPC .......... *G01R 31/343* (2013.01); *F04B 49/065* (2013.01); *G05B 9/02* (2013.01); *G05B 19/048* (2013.01); *G05B 23/0264* (2013.01); *G07C 3/00* (2013.01); *G07C 3/10* (2013.01); *G08C 15/00* (2013.01); *G08C 19/02* (2013.01); *G08C 19/14* (2013.01); *G08C 19/22* (2013.01); *H02P 29/032* (2016.02)

(58) Field of Classification Search
CPC ......... B60L 2220/44; H02P 23/14; H02P 6/30
See application file for complete search history.

(56) References Cited

U.S. PATENT DOCUMENTS

| 6,247,548 B1 * | 6/2001 | Hayashi | .................. B60L 58/25 180/206.2 |
| 2006/0142953 A1 * | 6/2006 | Mueller | .............. G01F 23/2966 702/22 |

(Continued)

FOREIGN PATENT DOCUMENTS

WO    WO-2009109245 A1 *    9/2009    .............. H02P 23/14

*Primary Examiner* — Kawing Chan
*Assistant Examiner* — Charles S Laughlin
(74) *Attorney, Agent, or Firm* — Renner Kenner Greive Bobak Taylor & Weber

(57) ABSTRACT

A method for protecting a nonmobile work machine driven by an electric motor includes determining, via a measuring unit, at least one measured value of a time-critical parameter of the work machine. The work machine is switched off when the determined measured value of the time-critical parameter is outside a predefined setpoint range. The determined measured value of the time-critical parameter is quantized in a level signal and transmitted as a first signal to an evaluation unit via an interface, and a second signal for further information concerning the work machine, to be transmitted from the measuring unit to the evaluation unit, is modulated to the first signal.

16 Claims, 3 Drawing Sheets

(51) Int. Cl.

| | |
|---|---|
| *G01R 31/34* | (2006.01) |
| *G05B 9/02* | (2006.01) |
| *G08C 15/00* | (2006.01) |
| *G08C 19/02* | (2006.01) |
| *G08C 19/14* | (2006.01) |
| *G08C 19/22* | (2006.01) |
| *G07C 3/00* | (2006.01) |
| *G07C 3/10* | (2006.01) |
| *H02P 29/032* | (2016.01) |
| *F04B 49/06* | (2006.01) |
| *G05B 23/02* | (2006.01) |
| *G05B 19/048* | (2006.01) |

(56) References Cited

U.S. PATENT DOCUMENTS

2015/0338284 A1   11/2015  Peng et al.
2016/0072707 A1*  3/2016  Braatz .................... H04L 45/72
                                            375/260

\* cited by examiner

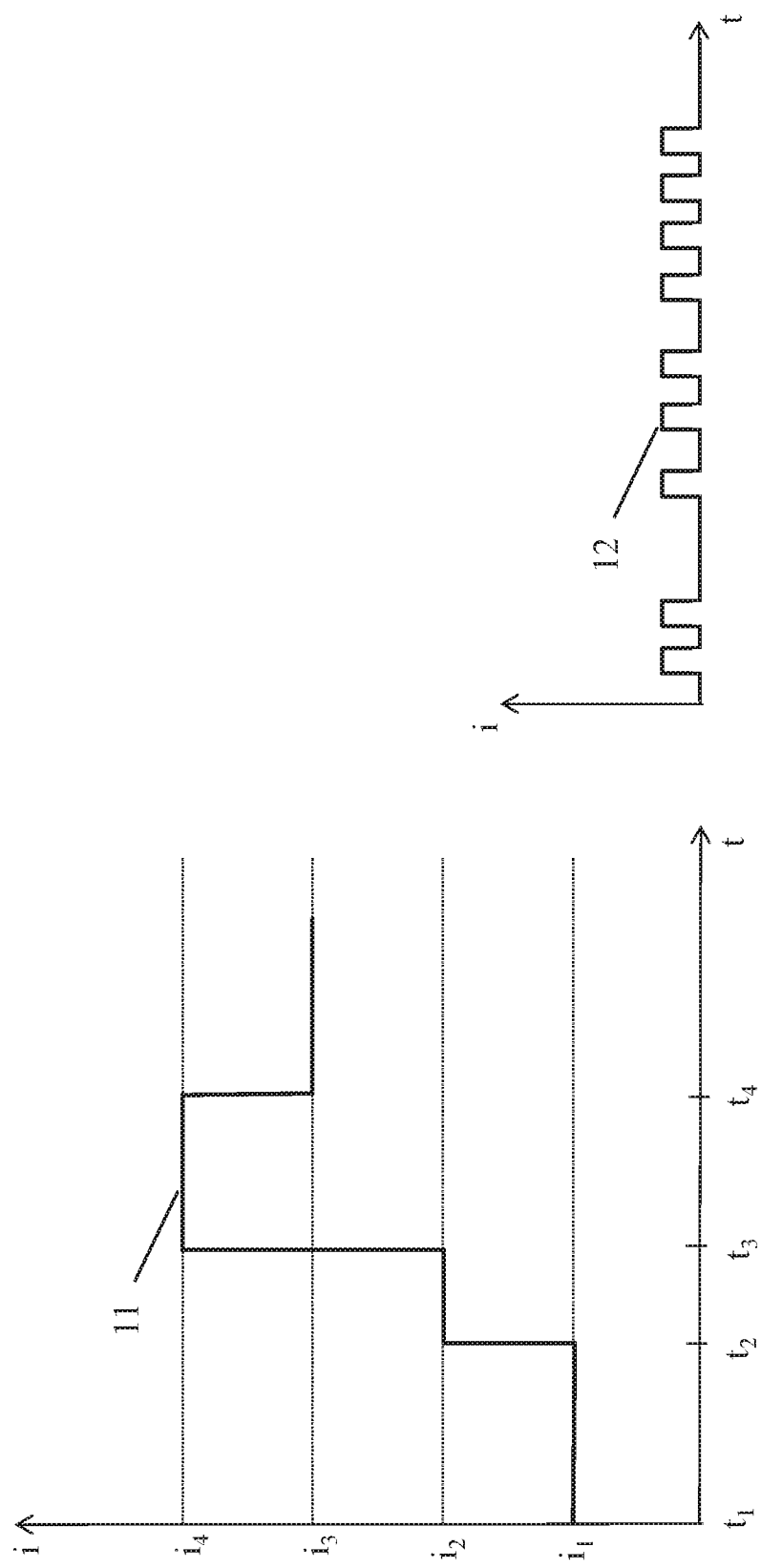

METHOD FOR PROTECTING A NONMOBILE WORK MACHINE DRIVEN BY AN ELECTRIC MOTOR, AND NONMOBILE WORK MACHINE DRIVEN BY AN ELECTRIC MOTOR

TECHNICAL FIELD

The invention relates to a method for protecting a nonmobile work machine driven by an electric motor, and a nonmobile work machine driven by an electric motor.

BACKGROUND

Electric motors of work machines are at risk of overheating the motor winding, whereby overloading, poor power grid quality (undervoltage/overvoltage), hindered cooling, a blocked rotor, or the like are the most common reasons for failure. Motors with a high utilization capacity, such as refrigeration compressor motors, are subject to forced cooling, and must be provided with special protection from such risks.

A protective device for temperature monitoring using a measuring circuit is known from DE 10 2014 107 170 A1, having a quantitative temperature sensor and at least one qualitative temperature sensor that are situated at a suitable location, for example in the winding of the motor. The protective device also has a triggering device with an evaluation device in order to evaluate the measuring signal that results from the total resistance of the measuring circuit, and to generate an output signal for the triggering device as a function of the measuring signal.

SUMMARY OF THE INVENTION

The object of the invention is to improve the communication between the measuring unit and the evaluation unit in a cost-effective manner.

This object is achieved according to the invention by the features of Claims 1 and 13.

In the method according to the invention for protecting a nonmobile work machine driven by an electric motor, at least one measured value of a time-critical parameter of the work machine is determined via a measuring unit, the work machine being switched off when the determined measured value of the time-critical parameter is outside a predefined setpoint range. The determined measured value of the time-critical parameter is quantized in a level signal and transmitted as a first signal to an evaluation unit via an interface, and a second signal for further information concerning the work machine, to be transmitted from the measuring unit to the evaluation unit, is modulated to the first signal.

The nonmobile work machine according to the invention driven by an electric motor has a protective device that includes at least one measuring unit and one evaluation unit, which are connected to one another for transmitting information via a current interface, a first signal to be transmitted from the measuring unit to the evaluation unit being designed as a level signal, and the evaluation unit being connected to a switch-off device for switching off the work machine as a function of the first signal. In addition, a second signal to be transmitted from the measuring unit to the evaluation unit is modulated to the first signal.

A time-critical parameter of the work machine is understood to mean a parameter that may result in the work machine being switched off when the determined measured value is outside a predefined setpoint range. This may be in particular the winding temperature of the electric motor. For this purpose, a suitable temperature sensor, for example a sensor circuit having at least one PTC resistor, is situated in at least one of the windings of the electric motor.

The determined measured value of the time-critical parameter is quantized in countable levels ($i_1$, $i_2$, $i_3$, $i_4$ in FIG. 2) (countable level signal) and transmitted, in the simplest case only two levels being provided, namely, one level for a noncritical state and one level for a critical state of the work machine. Of course, three, four, or more different levels may also be defined and transmitted in order to describe the instantaneous state of the work machine. If the time-critical parameter is outside a predefined setpoint range, a level is transmitted to the evaluation unit, where the switch-off of the work machine is brought about before it is damaged.

To increase the information content of the information transmitted between the measuring unit and the evaluation unit, a second signal to be transmitted from the measuring unit to the evaluation unit is modulated to the first signal. The second signal may involve in particular information that is not relevant for safety, and therefore also not used for switching off the work machine. Accordingly, a low transmission rate for the modulated second signal may also be selected, which typically has a much higher information content compared to the first signal. While the information content of the first signal is only one bit or a few bits, depending on the number of predefined signal levels, the information content of the second signal may be 1 kB or more, for example. The second signal may be used, for example, for service, maintenance, or troubleshooting of the work machine, or for optimizing the control/regulation.

Furthermore, the work machine may optionally be placed in a programming mode in which data are transmitted from the evaluation unit to the measuring unit via the interface. In this way, for example a changed number of predefined signal levels for the time-critical signal 11, a new association of the levels with the temperature ranges, and/or other configuration values for the measuring unit may be transmitted from the evaluation unit to the measuring unit.

Fluid energy machines or a conveyor system or a hoist are preferably used as a work machine.

The first signal for representing different states of the work machine is transmitted at at least one first level and one second level, whereby the level of the first signal to be used depends on the determined measured value. The second signal is advantageously modulated to the first signal at a predefined amplitude that is smaller than the difference between the two levels. The particular level stage in which the first signal is situated may thus be unequivocally determined.

The evaluation unit is connected to a switch-off device for switching off the work machine as a function of the first signal. The switch-off device may in particular have at least one first protective relay that assumes a deactivated or activated state as a function of the first signal in order to switch off the work machine in the event of a malfunction. In addition, it is advantageous when the evaluation unit also has at least one display unit or data interface for outputting further information that is transmitted via the second signal.

BRIEF DESCRIPTION OF THE DRAWINGS

Further advantages and embodiments of the invention are explained in greater detail with reference to the following description and the drawings.

The drawings show the following:

FIG. 2: shows a quantized signal pattern (first signal) of the measured value of the time-critical parameter, FIG. 3: shows a signal pattern of a digital data signal (second signal according to a first variant) at a predefined amplitude and at a defined data transmission rate (baud rate)

DETAILED DESCRIPTION

Figure 1:
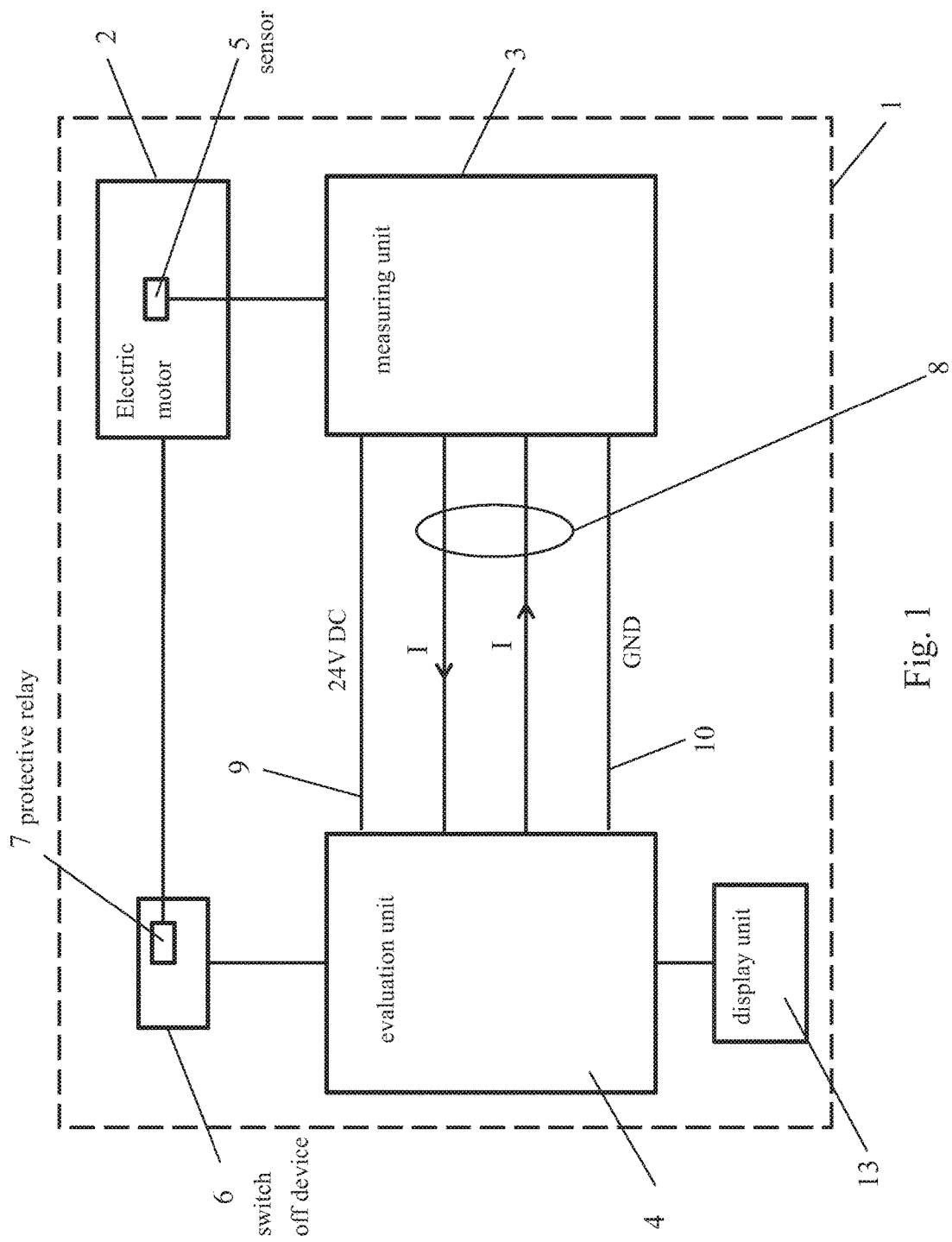
FIG. 1: shows a block diagram of the work machine according to the invention.

The block diagram in FIG. 1 shows a work machine 1, which in particular is a fluid energy machine (a compressor or a pump, for example) or a conveyor system or a hoist. The work machine in particular has an electric motor 2, a measuring unit 3, and an evaluation unit 4. The measuring unit 3 includes at least one sensor 5, which is a temperature sensor, for example, situated in one of the windings of the electric motor 2. The evaluation unit 4 is connected to a switch-off device 6 which includes at least one first protective relay 7 that assumes a deactivated or activated state as a function of the first signal in order to switch off the work machine 1, in particular the electric motor thereof, in the event of a malfunction. The transmission of the information between the measuring unit 3 and the evaluation unit 4 takes place via a (current) interface 8, with a current loop I for transmitting information between the measuring unit 3 and the evaluation unit 4. In addition, a line 9 to the voltage supply, and a ground line 10 are provided.

Figure 5:
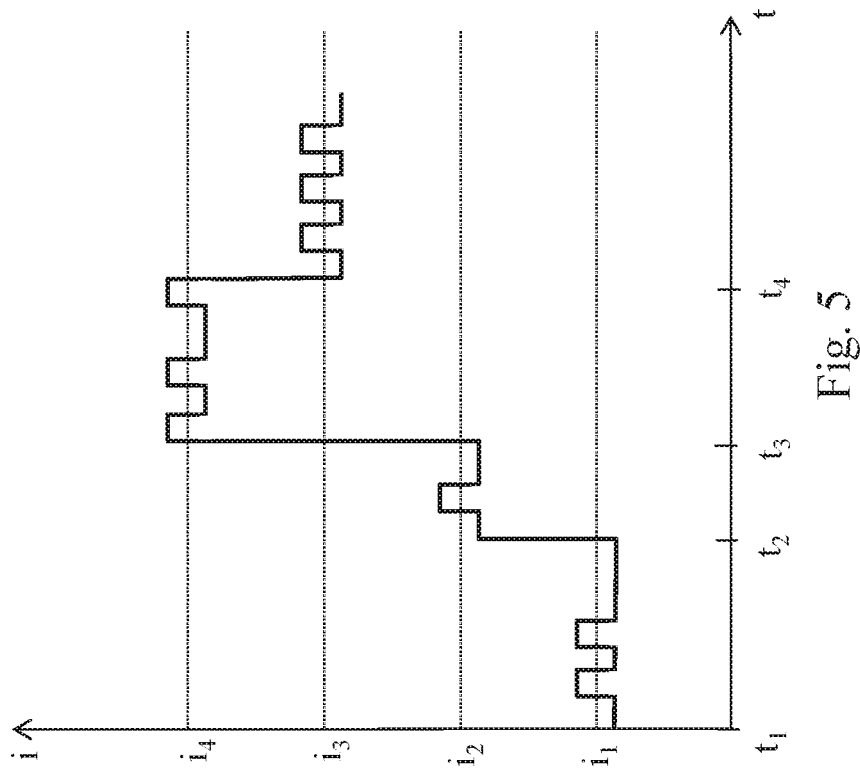
FIG. 5: shows a signal pattern of the mixed signal, the digital data signal (second signal) according to FIG. 2 being modulated to the first signal.

The signal transmitted between the measuring unit 3 and the evaluation unit 4 via the current loop I is a mixed signal made up of a first signal 11 and a second signal 12 (FIG. 5). In the illustrated exemplary embodiment, the first signal, which transmits the time-critical parameter determined via the sensor 5, may assume four different predefined levels $i_1$, $i_2$, $i_3$, $i_4$ (FIG. 2), each corresponding to different states of the work machine. Thus, for example, it may be specified in the evaluation unit 4 that at a level $i_4$, the switch-off device 6 or its protective relay 7 causes the work machine 1 to switch off. The other three levels $i_1$, $i_2$, $i_3$ indicate states of the work machine that are still noncritical, and depending on the level, may correspond to different temperatures of the motor winding, for example.

The second signal 12 may be a digital data signal having a predefined amplitude (FIG. 3), the digital data signal being made up of a higher (high) and a lower (low) signal level. According to FIG. 5, the second signal 12 in FIG. 3, having a predefined amplitude, is modulated to the first signal 11.

While the information content of the first signal 11 in the illustrated exemplary embodiment is only 2 bits (4 states), a significantly higher information content of typically several kB may be transmitted via the second signal.

The time-critical parameter, which is transmitted as the first signal, indicates in real time the instantaneous state of the work machine, and therefore may cause the work machine to switch off within a very short time if the time-critical parameter, which is determined by the sensor 5, should be outside a predefined setpoint range. The information of the second signal, which requires a significantly longer time for transmission, thus does not delay the transmission of the first signal. The second signal 12 is not safety-relevant, and therefore also does not result in the work machine being switched off. Consequently, there is also no real-time requirement here.

Figure 4:
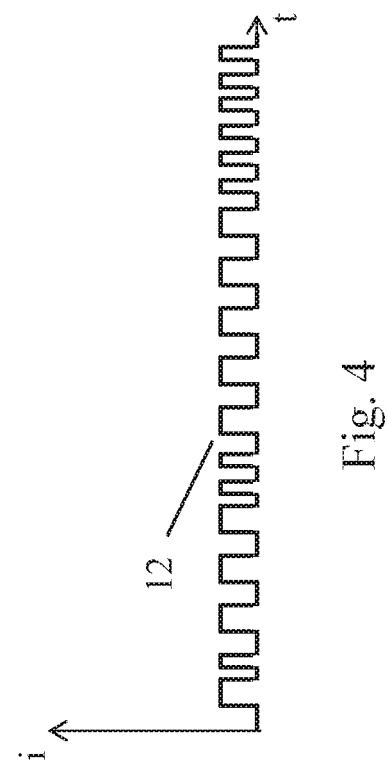
FIG. 4: shows a signal pattern of a digital frequency-modulated data signal (second signal according to a second variant) that is formed from two different frequencies.

The digital data signal may be formed by other modulation methods such as period modulation, frequency modulation, or pulse width modulation (FIG. 4). Similarly, the second signal 12 according to FIG. 4 may also be modulated to the first signal 11 (FIG. 2).

In addition to the transmission of the first and second signals 11 and 12 between the measuring unit and the evaluation unit, it is also possible to transmit information from the evaluation unit 4 to the measuring unit 3 via the current loop, for example by placing the work machine 1 in a particular programming mode. This information may be, for example, a changed number of predefined signal levels for the time-critical signal 11, a new association of the levels with the temperature ranges, and/or other configuration values for the measuring unit 3. The work machine 1 may be brought into the particular programming mode, for example, by connecting a very uncommon resistance value, which is never to be expected during normal operation of the work machine 1, to the measuring unit 3 at the location of the temperature sensor 5 within the first three seconds after the supply voltage is switched on.

The evaluation unit 4 may also have least one display unit 13 or a data interface for outputting further information that is transmitted via the second signal 12.

The invention claimed is:

1. A method for protecting a nonmobile work machine driven by an electric motor, at least one measured value of a time-critical parameter of the work machine being determined via a measuring unit, the work machine being switched off when the determined measured value of the time-critical parameter is outside a predefined setpoint range, and the determined measured value of the time-critical parameter being quantized in a level signal ($i_1$, $i_2$, $i_3$, $i_4$) and transmitted as a first signal to an evaluation unit via an interface, wherein a second signal for further information concerning the work machine, to be transmitted from the measuring unit to the evaluation unit, is modulated to the first signal at an amplitude that is smaller than the smallest difference between all provided levels of the first signal.

2. The method according to claim 1, wherein a fluid energy machine, a conveyor system, or a hoist is used as the work machine.

3. The method according to claim 1, wherein the determined measured value of the time-critical parameter for representing different states of the work machine is quantized in at least two different levels and transmitted as the first signal.

4. The method according to claim 1, wherein the second signal is a digital data signal having a defined data transmission rate.

5. The method according to claim 1, wherein the second signal is modulated to the first signal at a predefined amplitude.

6. The method according to claim 4, wherein the second signal is formed from a higher signal level and a lower signal level.

7. The method according to claim 4, wherein the second signal is frequency-modulated and formed from two different frequencies.

8. The method according to claim 1, wherein a demodulation is provided, wherein the first signal and the second signal are evaluated separately, and thus independently of one another.

9. The method according to claim 1, wherein the work machine may be placed in a programming mode in which data are transmitted from the evaluation unit to the measuring unit via the interface.

10. The method according to claim 1, wherein a current interface, voltage interface, optical interface, or some other physical interface is used as the interface between the evaluation unit and the measuring unit.

11. A method for protecting a nonmobile work machine driven by an electric motor, at least one measured value of a time-critical parameter of the work machine being determined via a measuring unit, the work machine being switched off when the determined measured value of the time-critical parameter is outside a predefined setpoint range, and the determined measured value of the time-critical parameter being quantized in a level signal ($i_1$, $i_2$, $i_3$, $i_4$) and transmitted as a first signal to an evaluation unit via an interface, wherein a second signal for further information concerning the work machine, to be transmitted from the measuring unit to the evaluation unit, is modulated to the first signal wherein the second signal is a digital data signal having a defined data transmission rate and wherein the second signal is modulated by pulse width modulation, wherein the digital data signal of the second signal is made up of two different pulse widths of the positive pulse, of the negative pulse, or both.

12. A nonmobile work machine driven by an electric motor, and having a protective device that includes at least one measuring unit and one evaluation unit, which are connected to one another for transmitting information via an interface, a first signal to be transmitted from the measuring unit to the evaluation unit being designed as a level signal, and the evaluation unit being connected to a switch-off device for switching off the work machine as a function of the first signal wherein a second signal to be transmitted from the measuring unit to the evaluation unit is modulated to the first signal at an amplitude that is smaller than the smallest difference between all provided levels of the first signal.

13. The work machine according to claim 12, wherein the measuring unit has at least one first sensor for determining a time-critical parameter of the work machine.

14. The work machine according to claim 12, wherein the switch-off device has at least one first protective relay that assumes a deactivated or activated state as a function of the first signal in order to switch off the work machine in the event of a malfunction.

15. The work machine according to claim 12, wherein the evaluation unit also has at least one display unit or data interface for outputting further information that is transmitted via the second signal.

16. A nonmobile work machine driven by an electric motor, and having a protective device that includes at least one measuring unit and one evaluation unit, which are connected to one another for transmitting information via an interface, a first signal to be transmitted from the measuring unit to the evaluation unit being designed as a level signal, and the evaluation unit being connected to a switch-off device for switching off the work machine as a function of the first signal wherein a second signal to be transmitted from the measuring unit to the evaluation unit is modulated to the first signal by pulse width modulation, wherein the digital data signal of the second signal is made up of two different pulse widths of the positive pulse, of the negative pulse, or both.

* * * * *